US007759860B2

(12) United States Patent  
Bae et al.

(10) Patent No.: US 7,759,860 B2
(45) Date of Patent: Jul. 20, 2010

(54) DUAL PANEL-TYPE ORGANIC ELECTROLUMINESCENT DISPLAY DEVICE AND METHOD OF FABRICATING THE SAME

(75) Inventors: Sung Joon Bae, Seongnam-si (KR); Jae Yoon Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 706 days.

(21) Appl. No.: 11/117,289

(22) Filed: Apr. 29, 2005

(65) Prior Publication Data

US 2005/0242717 A1 Nov. 3, 2005

(30) Foreign Application Priority Data

Apr. 30, 2004 (KR) .................... 10-2004-0030382

(51) Int. Cl.
*H05B 33/00* (2006.01)
*H01J 63/04* (2006.01)
*H01J 9/00* (2006.01)

(52) U.S. Cl. .................... 313/506; 313/504; 313/505; 445/24; 257/40; 257/79

(58) Field of Classification Search ............ None
See application file for complete search history.

(56) References Cited

U.S. PATENT DOCUMENTS

2003/0201445 A1* 10/2003 Park et al. ................ 257/79

2004/0069986 A1* 4/2004 Park et al. ................ 257/40
2004/0140759 A1* 7/2004 Park et al. ................ 313/504

FOREIGN PATENT DOCUMENTS

CN 1477912 2/2004
JP 2003-208108 7/2003

* cited by examiner

*Primary Examiner*—Sikha Roy
(74) *Attorney, Agent, or Firm*—McKenna Long & Aldridge

(57) ABSTRACT

An organic electro-luminescence device is provided. First and second substrates are arranged spaced apart from each other by a predetermined distance and sub-pixels are defined in the substrates. An array element has at least one thin film transistor (TFT) formed on an inner surface of the first substrate in sub-pixel unit. A conductive spacer is electrically connected to a drive TFT of the array element. A first electrode for an organic electro-luminescence diode is disposed on an inner surface of the second substrate. An organic electro-luminescence layer and a second electrode for the organic electro-luminescence diode are sequentially formed on the first electrode in sub-pixel unit. The first substrate and the second substrate are misaligned by a predetermined position and attached to each other, such that the conductive spacer is in contact with a conductive spacer contact region provided on the second electrode.

10 Claims, 7 Drawing Sheets

Rleated art

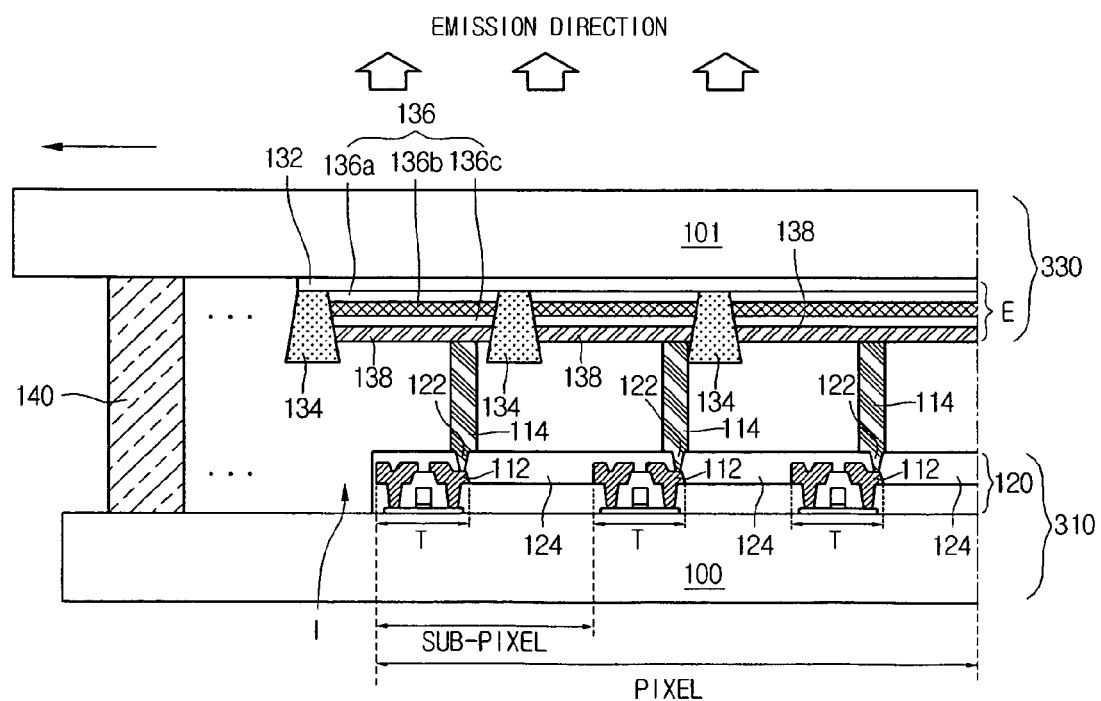

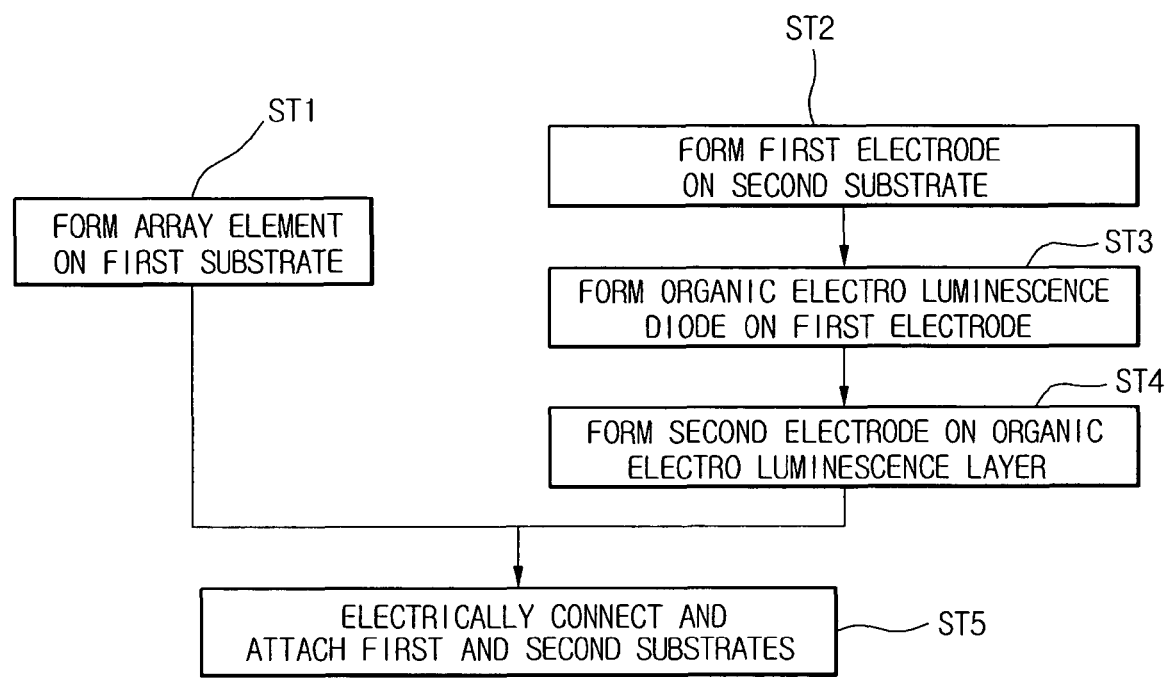

DUAL PANEL-TYPE ORGANIC ELECTROLUMINESCENT DISPLAY DEVICE AND METHOD OF FABRICATING THE SAME

This application claims the benefit of Korean Patent Application No. 30382, filed on Apr. 30, 2004, which is hereby incorporated by reference for all purposes as if fully set forth herein.

BACKGROUND OF THE INVENTION

1. Field of the Invention

The present invention relates to an organic electro-luminescence device, and more particularly, to an organic electro-luminescence device having upper and lower substrates asymmetrically attached to each other and a method fabricating method same.

2. Description of the Related Art

In the field of flat panel display devices, liquid crystal display devices (LCD) are widely used because of they are lightweight and have low power consumption. However, the LCD is a non-luminous display device and has technical limitations with regard to brightness, contrast, viewing angle, and large display size. Therefore, new flat panel display devices capable of overcoming these drawbacks are actively being developed.

One of these new flat panel display devices is the organic electro-luminescence display device. The organic electro-luminescence devices are self-luminous display devices, therefore they have high contrast and a wide viewing angle compared with LCDs. Also, since the organic electro-luminescence device does not require a backlight assembly, it is lightweight and slim. In addition, the organic electro-luminescence device can decrease power consumption.

Further, the organic electro-luminescence device can be driven with a low DC voltage and has a fast response speed. Since all of the components of the organic electro-luminescence device are formed of solid materials, it is durable against external impact. It can also be used in a wide temperature range and can be manufacture at a low cost.

Specifically, the organic electro-luminescence device is easily fabricated through a deposition and encapsulation process. Therefore, the apparatus and method of fabricating the organic electro-luminescence device are simpler than those of an LCD or PDP.

If the organic electro-luminescence device is driven in an active matrix type, uniform brightness can be obtained even when a low current is applied. Accordingly, the organic electro-luminescence device has the advantages of low power consumption, high definition and large-sized screen.

FIG. 1 is a schematic view of a section of a related art active matrix organic electro-luminescence device (AMOLED) that operates in a bottom emission type.

As illustrated in FIG. 1, first and second substrates 10 and 30 are arranged to face each other. Edge portions of the first and second substrates 10 and 30 are encapsulated by a seal pattern 40. A TFT (T) is formed on a transparent substrate 1 of the first substrate 10 in each sub-pixel unit. A first electrode 12 is connected to the TFT. An organic electro-luminescence layer 14 is formed on the TFT and the first electrode 12 and is arranged corresponding to the first electrode 12. The organic electro-luminescence layer 14 contains light emission materials taking on red, green and blue colors. A second electrode 16 is formed on the organic electro-luminescence layer 14.

The first and second electrodes 12 and 16 function to apply an electric field to the organic electro-luminescence layer 14.

Due to the seal pattern 40, the second electrode 16 and the second substrate 30 are spaced apart from each other by a predetermined distance. Therefore, an absorbent (not shown) and a translucent tape (not shown) may be further provided on an inner surface of the second substrate 30. The absorbent absorbs moisture introduced from the exterior, and the translucent tape adheres the absorbent to the second substrate 30.

In the bottom emission type structure, when the first electrode 12 and the second electrode 16 are respectively an anode and a cathode, the first electrode 12 is formed of a transparent conductive material and the second electrode 16 is formed of a metal having a low work function. In such a condition, the organic electro-luminescence layer 14 includes a hole injection layer 14a, a hole transporting layer 14b, an emission layer 14c, and an electron transporting layer 14d, which are sequentially formed on a layer contacting with the first electrode 12.

The emission layer 14c has red, green and blue color filters in sub-pixels.

Like this, in the related art organic electro-luminescence device, the array element (A) and the organic electro-luminescence diode (E) are stacked on the same substrate.

The bottom emission type organic electro-luminescence device is fabricated by attaching the substrate, where the array element and the organic electro-luminescence diode are formed, to the separate substrate provided for the encapsulation. In this case, the yield of the organic electro-luminescence device is determined by the product of the yield of the array element and the yield of the organic electro-luminescence diode. Therefore, the entire process yield is greatly restricted by the late process, that is, the process of forming the organic electro-luminescence diode. For example, even though excellent array elements are formed, if foreign particles or other factors cause defects in forming the organic electro-luminescence layer using a thin film of about 1000 Å thick, the corresponding organic electro-luminescence device is a defective grade.

Thus, there occurs loss of every expense and material cost spent in fabricating the non-defective array element, resulting in yield reduction.

In addition, the bottom emission type organic electro-luminescence device has high stability and high degree of freedom due to the encapsulation, but has limitation in aperture ratio. Thus, the bottom emission type organic electro-luminescence device is difficult to apply to high-definition products. Meanwhile, in the case of the top emission type organic electro-luminescence device, the design of the TFT is easy and the aperture ratio is high. Thus, it is advantageous in view of lifetime of the product. However, since the cathode is disposed on the organic electro-luminescence layer, the selection of material is restricted. Consequently, the transmittance is limited and the luminous efficiency is degraded.

SUMMARY OF THE INVENTION

Accordingly, the present invention is directed to an organic electro-luminescence device and method of fabricating same that substantially obviates one or more problems due to limitations and disadvantages of the related art.

An advantage of the present invention is to provide an organic electro-luminescence device and method of fabricating same wherein corresponding pixel regions of first and second substrates are not aligned accurately. Instead, they are misaligned by position of the conductive spacers designed on each substrate and then attached to each other. In this manner, the position of the conductive spacer is set free, such that design margin of the TFTs on the lower substrate can be reduced.

Additional features and advantages of the invention will be set forth in the description which follows, and in part will become apparent from the description, or may be learned by practice of the invention. The objective and other advantages of the invention may be realized and attained by the structure particularly pointed out in the written description and claims hereof as well as the appended drawings.

To achieve these objective and other advantages and in accordance with the purpose of the invention, as embodied and broadly described herein, there is provided an organic electro-luminescence device first and second substrates spaced a predetermined distance apart from each other, sub-pixels being defined in the substrates; an array element having at least one thin film transistor (TFT) formed on an inner surface of the first substrate in each sub-pixel unit; a conductive spacer electrically connected to a drive TFT of the array element; a first electrode for an organic electro-luminescence diode disposed on an inner surface of the second substrate; and an organic electro-luminescence layer and a second electrode for the organic electro-luminescence diode, which are sequentially formed on the first electrode in each sub-pixel unit, wherein the first substrate and the second substrate are misaligned by a predetermined distance and attached to each other, such that the conductive spacer is in contact with a conductive spacer contact region provided on the second electrode.

In another aspect of the present invention, there is provided a method of fabricating an organic electro-luminescence device, the method comprising: forming an array element having at least one TFT formed on an inner surface of a first substrate in a sub-pixel unit; forming a conductive spacer electrically connected to a drive TFT of the array element; forming a first electrode for an organic electro-luminescence diode on an inner surface of a second substrate; sequentially forming an organic electro-luminescence layer and a second electrode for the organic electro-luminescence diode on the first electrode in the sub-pixel unit; and misaligning the first and second substrates by a predetermined distance and attaching the first and second substrates, such that the conductive spacer is in contact with a conductive spacer contact region provided on the second electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings:

FIG. 3 is a schematic view of section of a dual panel type organic electro-luminescence device according to an embodiment of the present invention;

FIG. 7 is a flowchart illustrating a method of fabricating an organic electro-luminescence device according to an embodiment of the present invention.

DETAILED DESCRIPTION OF THE INVENTION

Reference will now be made in detail to embodiments of the present invention, examples of which are illustrated in the accompanying drawings. Wherever possible, the same reference numbers will be used throughout the drawings to refer to the same or like parts.

Figure 1:
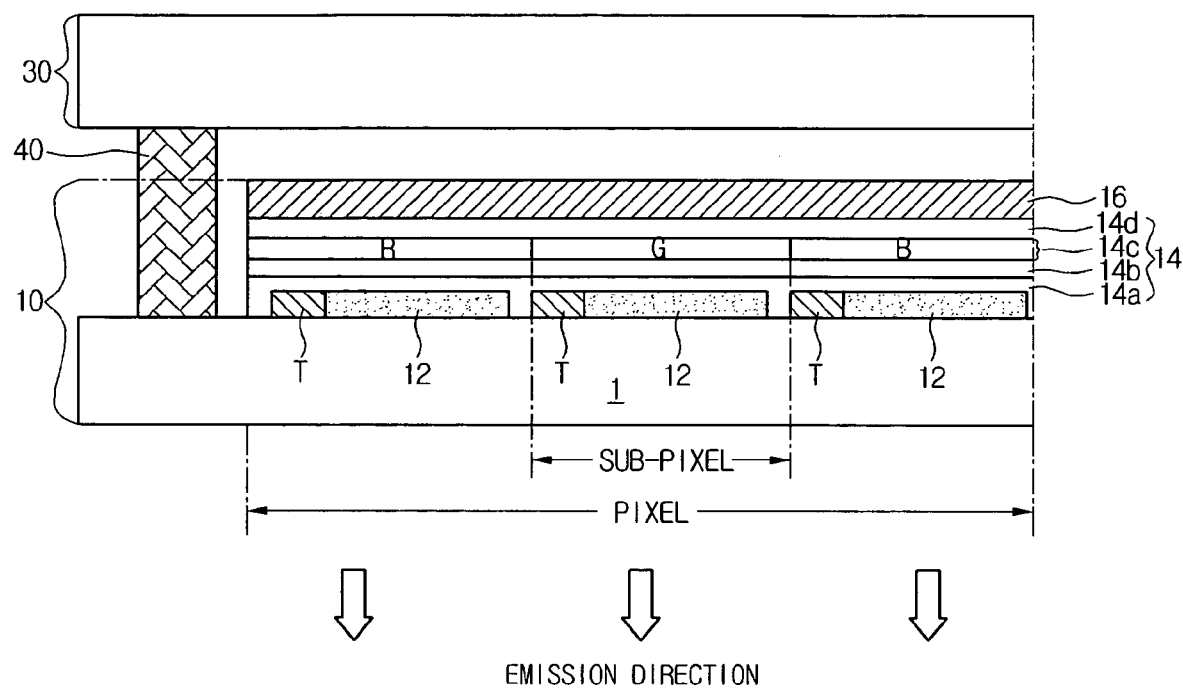
FIG. 1 is a schematic view of section of a related art organic electro-luminescence device.
Figure 2:
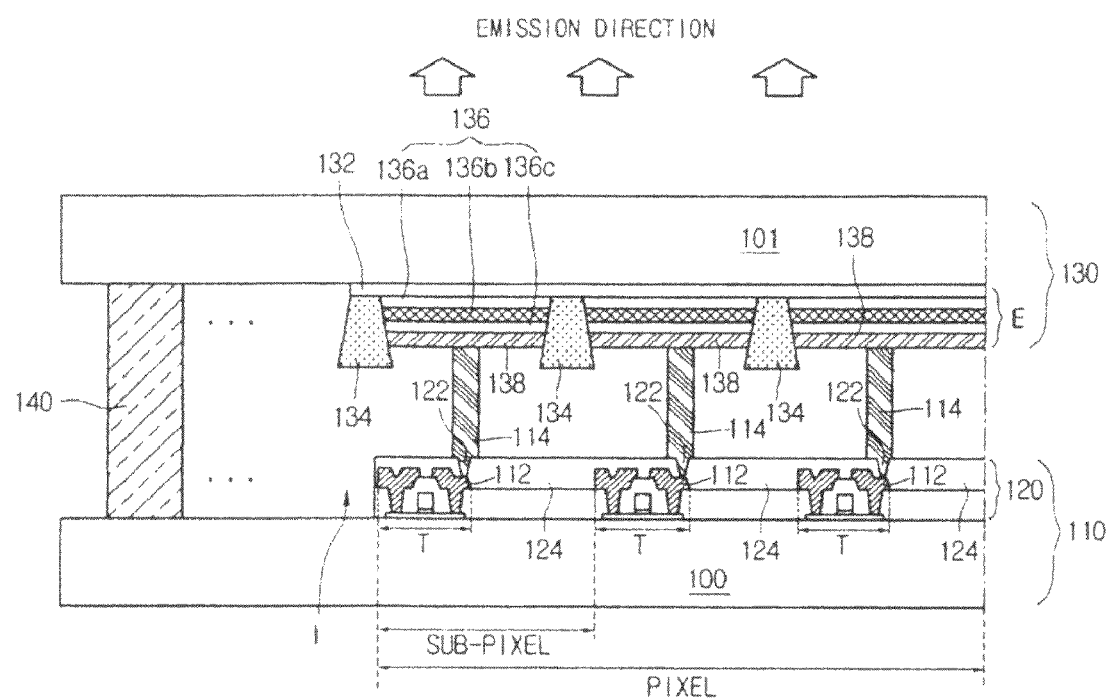
FIG. 2 is a schematic view of a section of a dual panel type organic electro-luminescence device.

FIG. 2 is a schematic view of section of a dual panel type organic electro-luminescence device. For the convenience of explanation, only one pixel region is illustrated in the drawing. Referring to FIG. 2, first and second substrates 110 and 130 are arranged spaced apart from each other by a predetermined distance. An organic electro-luminescence diode E is formed on an inner surface of a transparent substrate 101 of the second substrate 130. Edges of the first and second substrates 110 and 130 are encapsulated by a seal pattern 140.

The organic electro-luminescence diode E includes a first electrode 132 used, for example, as a common electrode, an electrode separator 134 disposed at a sub-pixel boundary below the first electrode 132, an organic electro-luminescence layer 136 disposed between electrode separators 134, and a second electrode 138 patterned for each sub-pixel.

Although not shown, a buffer is formed to partition the organic electro-luminescence layer 136 and prevent the first and second electrodes 132 and 138 from being shorted due to a conductive spacer 114.

The organic electro-luminescence layer 136 includes a first carrier transporting layer 136a, an emission layer 136b, and a second carrier transporting layer 136c, which are stacked in sequence. The first and second carrier transporting layers 136a and 136c function to inject electrons or holes into the emission layer 136b or transport them.

The first and second carrier transporting layers 136a and 136c are determined by arrangement of anode and cathode electrodes. For example, when the emission layer 136b is formed of high molecular compound and the first and second electrodes 132 and 138 are respectively configured as anode and cathode electrodes, the first carrier transporting layer 136a contacting with the first electrode 132 has a stacked structure of a hole injection layer and a hole transporting layer, and the second carrier transporting layer 136c contacting with the second electrode 138 has a stacked structure of an electron injection layer and an electron transporting layer.

Also, the organic electro-luminescence layer 136 may be formed of a high molecular compound or low molecular compound. When the organic electro-luminescence layer 136 is formed of a low molecular compound, it is formed using a vapor deposition process. When the organic electro-luminescence layer 136 is formed of a high molecular compound, it is formed using an inkjet process.

An array element 120 includes TFTs. In order to supply a current to the organic electro-luminescence diode E, cylindrical conductive spacers 114 are disposed at positions where the second electrode 138 and the TFTs T are connected in each sub-pixel unit.

Unlike a spacer for a general LCD, the main object of the conductive spacers 114 is to electrically connect the two substrates rather than to maintain a cell gap. The spacers 114 have constant height in the section between the two substrates.

The conductive spacer 114 electrically connects a drain electrode 112 of the TFT T provided on the first substrate in each sub-pixel unit and the second electrode 138 provided on the second substrate 130. The conductive spacer 114 is formed by coating a cylindrical spacer formed of an organic insulating layer with a metal. The conductive spacer 114 causes pixels of the first and second substrates 110 and 130 to be attached in 1:1 correspondence, such that a current can flow there through.

The connection portion of the conductive spacer 114 and the TFT T will now be described in more detail. A passivation layer 124 is formed at the region that covers the TFT T. The passivation layer 124 includes a drain contact hole 122 to expose a portion of the drain electrode 112. Here, the TFT T corresponds to a drive TFT connected to the organic electro-luminescence diode E.

The metal for the conductive spacer 114 is selected from conductive materials, preferably metal having ductility and a low specific resistance.

According to an embodiment of the present invention, the organic electro-luminescence device is a top emission type that emits light from the organic electro-luminescence layer 136 toward the second substrate 130. Preferably, the first electrode 132 is selected from conductive materials having a transmissive property, while the second electrode 138 is selected from opaque metal materials.

Also, the space I between the first substrate 110 and the second substrate 130 may be filled with an inert gas or insulating liquid.

Although not shown in the drawing, the array element 120 further includes a scan line, a signal line and power line intersecting the scan line and spaced apart from each other by a predetermined distance, a switching TFT disposed at an intersection of the scan line and the signal line, and a storage capacitor.

In a dual panel type organic electro-luminescence device, the array element and the organic electro-luminescence diode are configured on different substrates. Therefore, unlike the case where the array element and the organic electro-luminescence device are formed on the same substrate, the organic electro-luminescence diode is not influenced by the yield of the array element. Thus, the dual panel type organic electro-luminescence device can have a good characteristic in view of the production management of the respective elements.

If a screen is implemented in the top emission under the above-described conditions, the TFTs can be designed without considering aperture ratio, thereby increasing efficiency in the array process. Also, products having high aperture ratio and high resolution can be produced. Since the organic electro-luminescence diode is formed in a dual panel type, an outer air can be blocked more effectively compared with the related art top emission type, thereby enhancing stability of the product.

In addition, since the TFT and the organic electro-luminescence diode are formed on different substrates, a degree of freedom with respect to the arrangement of the TFTs can be sufficiently obtained. Since the first electrode of the organic electro-luminescence diode is formed on the transparent substrate, the degree of freedom with respect to the first electrode can be increased compared with the related art structure where the first electrode is formed on the array element.

In the dual panel type organic electro-luminescence device, when the organic electro-luminescence layer 136 is formed of high molecular material, the flow of high molecular ink is obstructed if the position where the conductive spacer 114 is in contact with the second substrate 130 is within the emission region, that is, the region where the organic electro-luminescence layer 136 is formed.

Accordingly, when the organic electro-luminescence layer 136 is formed of high molecular material, the conductive spacer 114 must be disposed at one edge of the pixel on the second substrate 130. In this case, the design about the position and shape of the TFTs provided on the first substrate 110 is greatly restricted.

Referring to FIG. 2, according to the design of the related array element 120, the conductive spacer 114 is generally connected to the drain electrode 112 of the drive TFT T and is in contact with the middle position of the emission region (that is, the area of the organic electro-luminescence layer 136) on the second substrate 130 when the first substrate 110 and the second substrate 130 are accurately aligned and attached to each other.

In the dual panel type organic electro-luminescence device shown in FIG. 2, it is very difficult to form the organic electro-luminescence layer 136 of high molecular compound.

Hereinafter, an organic electro-luminescence device that can solve these problems will be described in detail with reference to the accompanying drawings.

FIG. 3 is a schematic view of a section of a dual panel type organic electro-luminescence device according to an embodiment of the present invention. For the convenience of explanation, only one pixel region is illustrated in the drawing.

Figure 4A:
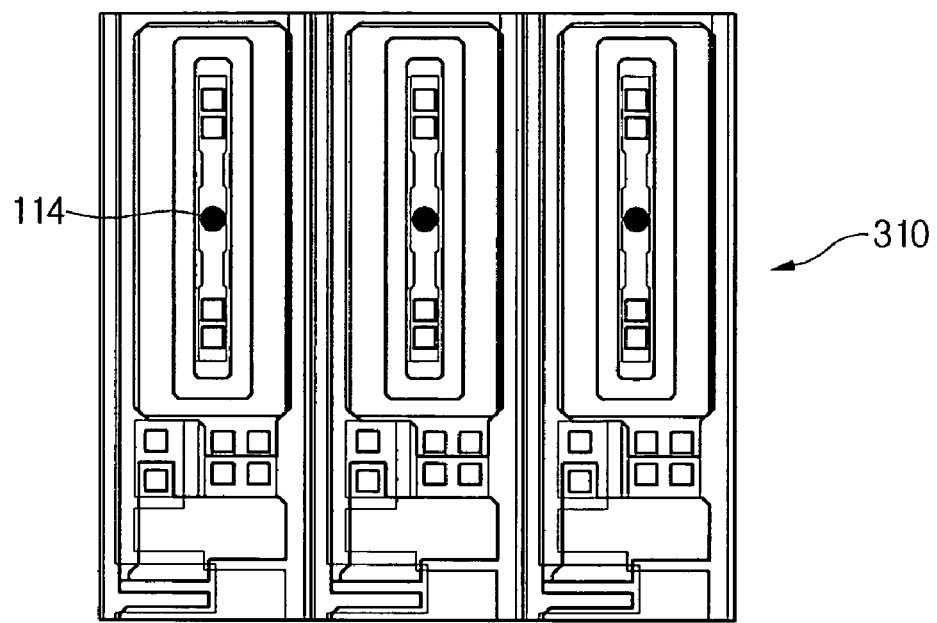
FIGS. 4A and 4B are schematic plan views illustrating first and second substrates of the dual panel type organic electro-luminescence device shown in FIG. 3.
Figure 4B:
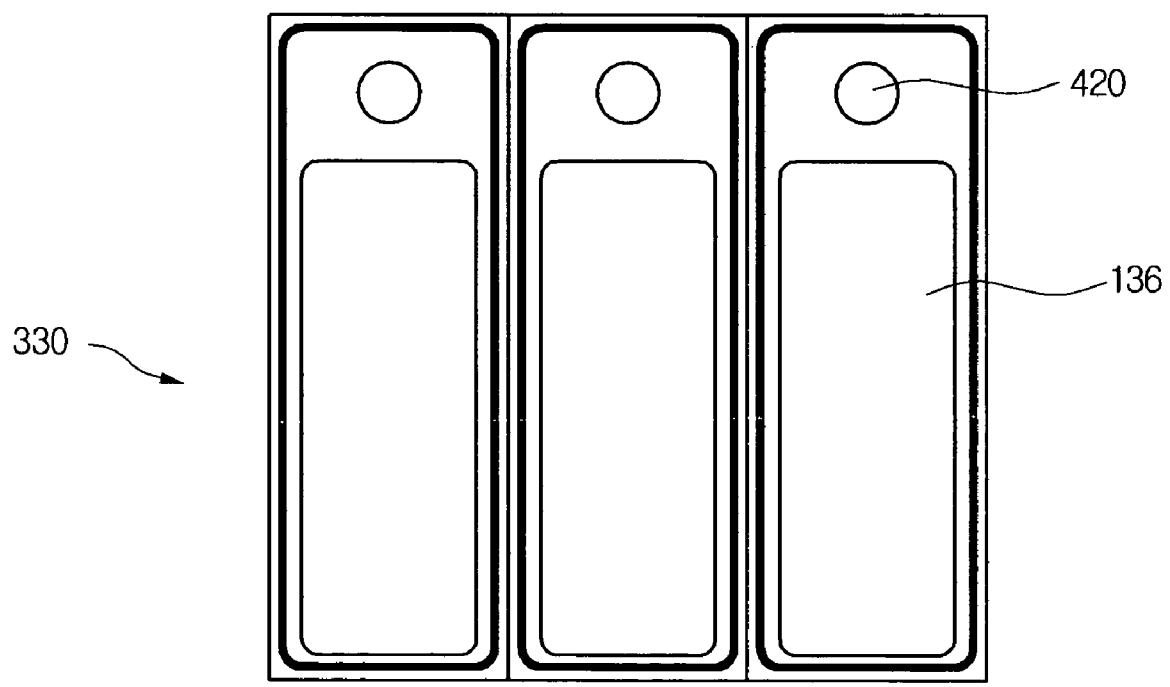

FIGS. 4A and 4B are schematic plan views illustrating first and second substrates of the dual panel type organic electro-luminescence device shown in FIG. 3.

In the dual panel type organic electro-luminescence device according to the present invention, corresponding pixel regions of the first and second substrates are not aligned accurately. Instead, they are misaligned by position of conductive spacers designed on each substrate and then attached to each other. In this manner, the position of the conductive spacer is set free, such that design margin of the array elements provided on the first substrate can be reduced.

As shown in FIG. 3, the second substrate 330 having the organic electro-luminescence diode E is not accurately aligned on the first substrate 310, but is shifted by a predetermined position and then attached asymmetrically. This aims to match the positions of the conductive spacer regions designed on each substrate.

Referring to FIGS. 4A and 4B, like the related art, the conductive spacer 114 provided on the first substrate 310 is formed at the center portion of the sub-pixel. The conductive spacer contact region 420 provided on the second substrate 330 is formed at one edge portion of the sub-pixel because the organic electro-luminescence layer 136 of the second substrate 330 is formed of high molecular material.

At this point, if the first substrate 310 and the second substrate 330 are accurately aligned and attached to each other, the position of the conductive spacer 114 formed on the first substrate 310 is different from that of the conductive spacer contact region 420 formed on the second substrate 330, depending on each sub-pixel.

In order to solve this problem, the related art uses a method of changing the design of the array element provided at the first substrate. On the contrary, the present invention shifts the first and second substrates 310 and 330 by a predetermined position and asymmetrically attaches them, such that the conductive spacer 114 of the first substrate 310 is matched with the conductive spacer contact region 420 of the second substrate. Accordingly, the design margin of the array element 120 (that is, a plurality of TFTs) formed on the first substrate 310 can be reduced.

Referring to FIG. 4B, the conductive spacer contact region 420 is formed on an upper end portion of each sub-pixel. Thus, when the first substrate 310 and the second substrate 330 are attached to each other, the second substrate 330 is shifted left by a predetermined distance as shown in FIG. 3. However, the present invention is not limited to this case.

Figure 5:
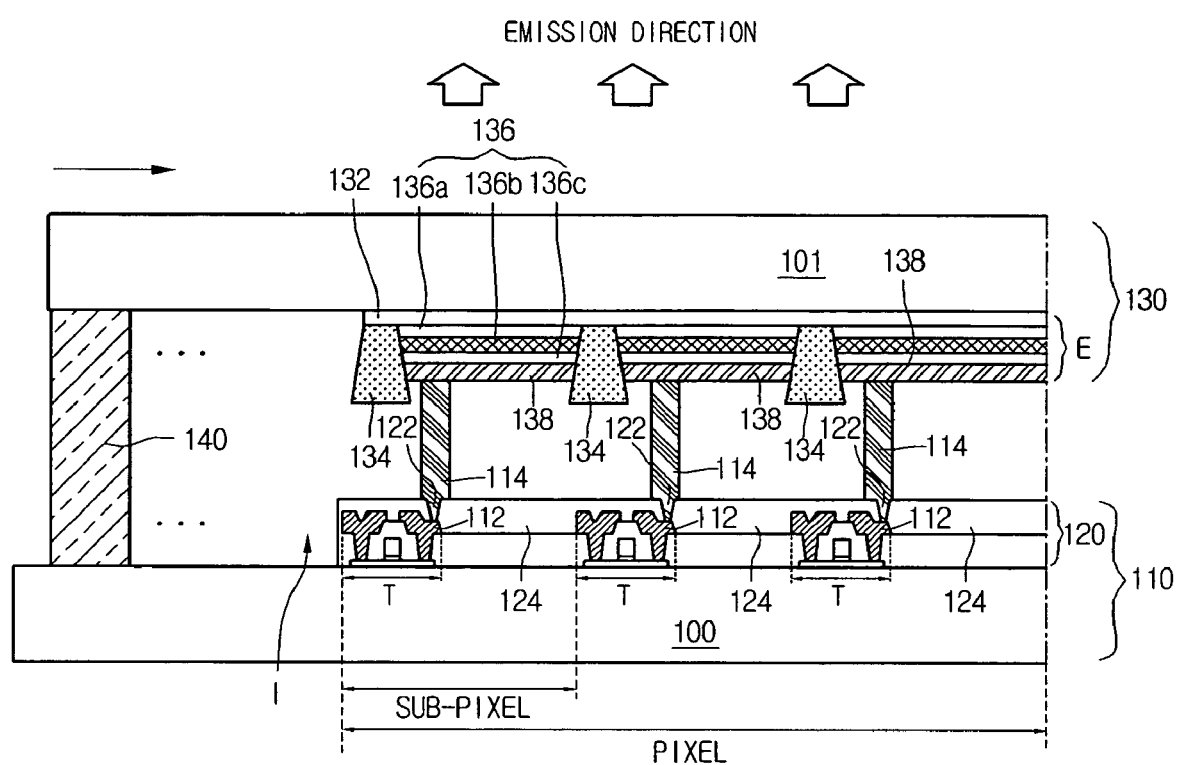
FIG. 5 is a schematic view of a section of a dual panel type organic electro-luminescence device according to another embodiment of the present invention.
Figure 6A:
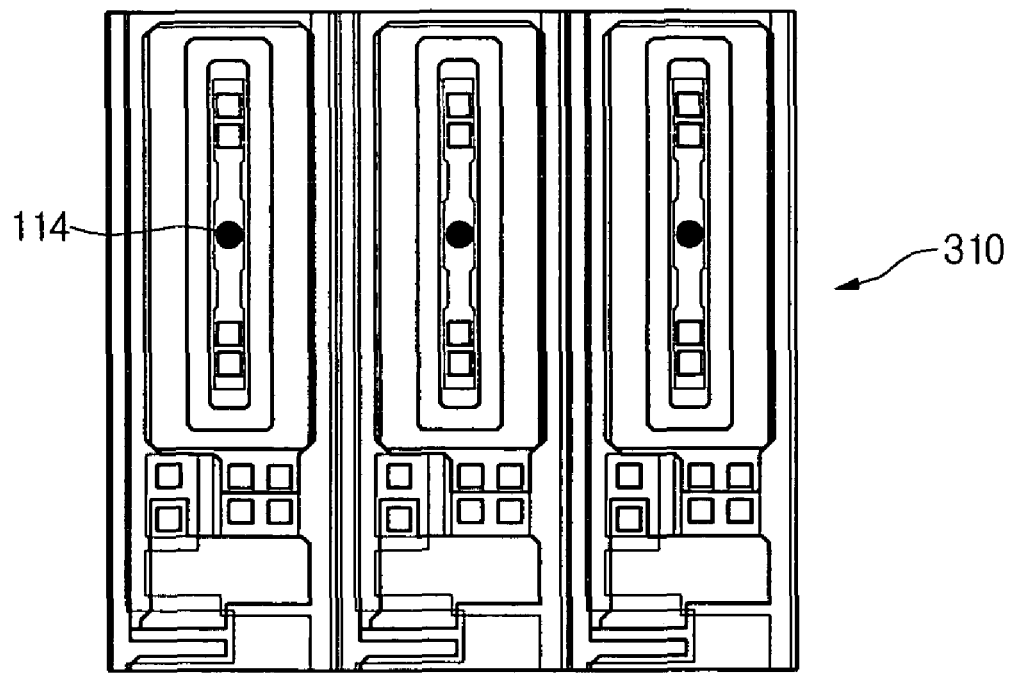
FIGS. 6A and 6B are schematic plan views illustrating first and second substrates of the dual panel type organic electro-luminescence device shown in FIG. 5.
Figure 6B:
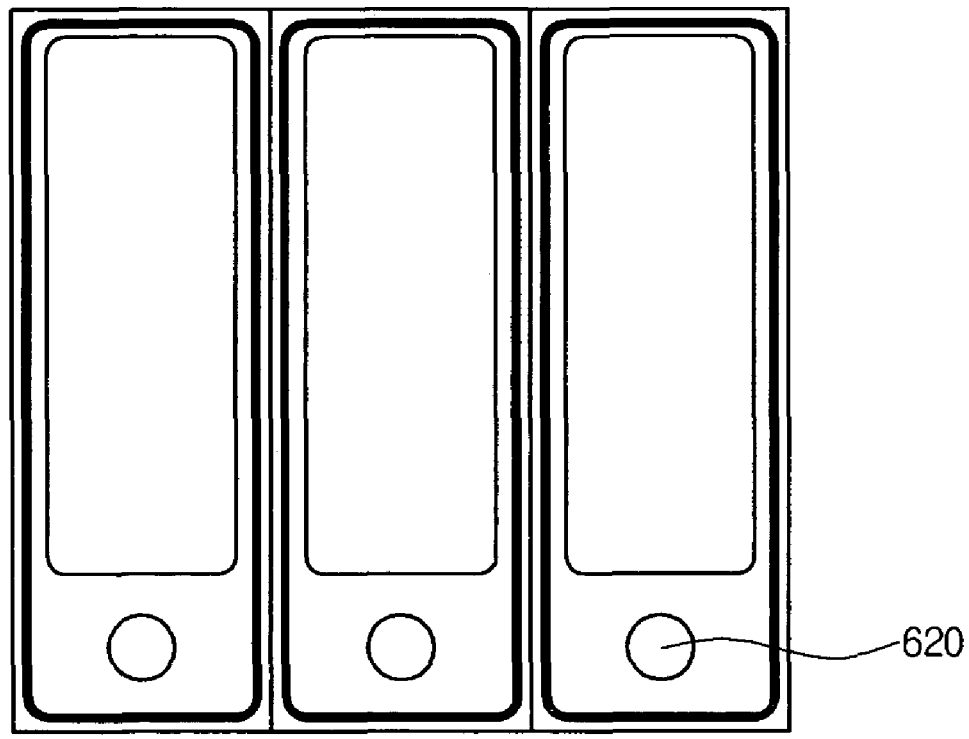

FIG. 5 is a schematic sectional view of a dual panel type organic electro-luminescence device according to another embodiment of the present invention, and FIGS. 6A and 6B are schematic plan views illustrating first and second substrates of the dual panel type organic electro-luminescence device shown in FIG. 5. For convenience of explanation, only one pixel region is illustrated.

Referring to FIG. 6B, in case where the conductive spacer contact region 620 is formed at a lower end portion of each sub-pixel, the second substrate 330 is shifted right by a predetermined distance and is attached to the first substrate 310, as shown in FIG. 5.

FIG. 7 is a flowchart illustrating a method of fabricating an organic electro-luminescence device according to the present invention.

As illustrated in FIG. 7, an array element is formed on a first substrate, at step ST1. For example, if a polysilicon TFT is provided, the formation of the array element includes: forming a buffer layer on a transparent substrate; forming a semiconductor layer and a capacitor electrode on the buffer layer; forming a gate electrode, and source and drain electrodes on the semiconductor layer; and forming a power electrode disposed on the capacitor electrode and connected to the source electrode.

Then, conductive spacers are formed as patterns for electrically connecting the first and second substrates. The conductive spacer electrically connects a drain electrode of a drive TFT provided on the first substrate in sub-pixel unit with the second electrode provided on the second substrate. The conductive spacer is formed by coating a cylindrical spacer formed of an organic insulating layer with a metal. The conductive spacer causes pixels of the first and second substrates to be attached in 1:1 correspondence, such that a current can flow there through.

In this embodiment, the conductive spacer is formed at the center portion of each sub-pixel provided on the first substrate.

At step ST2, a first electrode is formed on a second substrate. Accordingly, the first electrode and the array element are formed on different substrates. Since the first electrode for the organic electro-luminescence diode is directly formed on the transparent substrate, various materials can be used and it is easier to perform the fabricating process. The first electrode is selected from conductive materials having a transmissive property.

At step ST3, an organic electro-luminescence layer is formed on the first electrode. The organic electro-luminescence layer includes an emission layer and a transporting layer. The emission layer is formed of light emission material taking on red, green and blue colors, and the transporting layer injects and transports electrons or holes. The organic electro-luminescence layer is formed of high molecular material.

When the organic electro-luminescence layer is formed of high molecular material, the flow of high molecular ink is obstructed if the position where the conductive spacer is in contact with the second substrate is within the emission region, that is, the region where the organic electro-luminescence layer is formed. Accordingly, the conductive spacer contact region must be disposed at one edge of the pixel on the second substrate.

At step ST4, a second electrode is formed on the organic electro-luminescence layer. Finally, at ST5, the first and second substrates are electrically connected using the conductive spacer and are attached to each other.

That is, the first and second substrates are misaligned by a predetermined distance, so that the conductive spacer can be in contact with the conductive spacer contact region provided on the second electrode.

According to the present invention, production yield and production management efficiency are enhanced. Since the organic electro-luminescence device is the top emission type, the design of the TFTs becomes easy and high aperture ratio and high resolution can be provided. Also, since the electrode for the organic electro-luminescence diode is formed on the substrate, various materials can be used. In addition, since the organic electro-luminescence device is the top emission type and has the encapsulation structure, reliable products can be provided.

The corresponding pixel regions of the first and second substrates are not aligned accurately. Instead, they are misaligned by position of the conductive spacers designed on each substrate and then attached to each other. In this manner, the position of the conductive spacer is set free, such that design margin of the TFTs on the lower substrate can be reduced.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A dual panel-type organic electroluminescent display device comprising:
   first and second substrates spaced a predetermined distance apart from each other, corresponding sub-pixels being defined in the substrates;
   an array element having at least one thin film transistor (TFT) formed on an inner surface of each sub-pixel of the first substrate;
   a conductive spacer electrically connected to a drive TFT of the array element, and provided at the center portion of the sub-pixel of the first substrate,
   a first electrode for an organic electro-luminescence diode disposed on an inner surface of the sub-pixel of the second substrate; and
   an organic electro-luminescence layer as an emission region on the first electrode and a second electrode on the organic electro-luminescence layer for the organic electro-luminescence diode, which are sequentially formed in each sub-pixel of the second substrate,
   wherein the sub-pixel of the first substrate and the sub-pixel of the second substrate are misaligned by a predetermined distance and attached to each other, such that the conductive spacer is in contact with a conductive spacer contact region provided on the second electrode, in which the conductive spacer contact region is disposed at one edge portion of the sub-pixel of the second substrate, wherein the sub-pixel of the second substrate is extended in one direction, and wherein the conductive spacer contact region is disposed at an end portion of the sub-pixel of the second substrate.

2. The device according to claim 1, wherein the conductive spacer electrically connects a drain electrode of the drive TFT with the second electrode provided on the second substrate.

3. The device according to claim 2, wherein the conductive spacer is formed by coating an organic insulating layer with a metal.

4. The device according to claim 1, wherein the conductive spacer is formed at a predetermined position in each sub-pixel provided on the first substrate.

5. The device according to claim 1, wherein the organic electro-luminescence layer is formed of a high molecular material.

6. A method of fabricating a dual panel-type organic electroluminescent display device, the method comprising:

forming an array element having at least one TFT formed on an inner surface of a sub-pixel of a first substrate;

forming a conductive spacer electrically connected to a drive TFT of the array element, and provided at the center portion of the sub-pixel of the first substrate;

forming a first electrode for an organic electro-luminescence diode on an inner surface of a second substrate;

sequentially forming an organic electro-luminescence layer on the first electrode and a second electrode on the organic electro-luminescence layer for the organic electro-luminescence diode in each sub-pixel of the second substrate; and misaligning the first and second substrates by a predetermined distance and attaching the first and second substrates, such that the conductive spacer is in contact with a conductive spacer contact region provided on the second electrode, in which the conductive spacer contact region is disposed at one edge portion of the second electrode in the sub-pixel of the second substrate, wherein the sub-pixel of the second substrate is extended in one direction, and wherein the conductive spacer contact region is disposed at an end portion of the sub-pixel of the second substrate.

7. The method according to claim 6, wherein the organic electro-luminescence layer is formed of a high molecular material.

8. The method according to claim 6, wherein the conductive spacer contact region is formed at an edge portion of the sub-pixel.

9. The method according to claim 6, wherein the conductive spacer electrically connects a drain electrode of the drive TFT with the second electrode provided on the second substrate.

10. The method according to claim 9, wherein the conductive spacer is provided by coating an organic insulating layer with a metal.

* * * * *